United States Patent [19]

Cortellino et al.

[11] 3,996,393

[45] Dec. 7, 1976

[54] POSITIVE POLYMERIC ELECTRON BEAM RESISTS OF VERY GREAT SENSITIVITY

[75] Inventors: Charles A. Cortellino, Wappingers Falls, N.Y.; Edward Gipstein; William A. Hewett, both of Saratoga, Calif.; Duane E. Johnson, Los Gatos, Calif.; Wayne M. Moreau, Wappingers Falls, N.Y.

[73] Assignee: International Business Machines Corporation, Armonk, N.Y.

[22] Filed: Mar. 25, 1974

[21] Appl. No.: 454,058

[52] U.S. Cl. .................................. 427/43; 96/35.1; 96/36.2; 96/115 R; 427/273
[51] Int. Cl.² .......................................... B05D 3/06
[58] Field of Search ............ 117/93.31, 8; 96/35.1, 96/36.2, 115 R, 115 P; 427/43, 44, 273

[56] References Cited

UNITED STATES PATENTS

| 3,535,137 | 10/1970 | Haller et al. ........................ 427/43 |
| 3,779,806 | 12/1973 | Gipstein et al. ................ 117/93.31 |
| 3,932,352 | 1/1976 | Freedman et al. ........... 260/45.8 N |

OTHER PUBLICATIONS

Bowden et al. "Journal of Applied Polymer Science" vol. 17 pp. 3211–3221 Oct. 1973.

*Primary Examiner*—John H. Newsome
*Attorney, Agent, or Firm*—Joseph G. Walsh

[57] ABSTRACT

It has been discovered that the sensitivity of positive acting polymeric electron beam resists is increased by well over an order of magnitude by using polymers having a molecular weight of at least one million, thereby making it possible to reduce the required radiation to below $3 \times 10^{-6}$ coulombs/cm².

6 Claims, No Drawings

POSITIVE POLYMERIC ELECTRON BEAM RESISTS OF VERY GREAT SENSITIVITY

FIELD OF THE INVENTION

This invention is concerned with positive acting polymeric electron beam resists. In particular, it is concerned with resists having extremely high sensitivity so that they can be used with very low dosages of electron beam radiation. The polymers of the present invention are characterized by having a molecular weight of at least one million.

PRIOR ART

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involves exposing selected portions of the polymer film to electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

The present invention goes directly against the teaching of the prior art. For example, the Haller et al patent specifically teaches (Col. 6, line 30) that the molecular weight of the polymer is not critical to the process, but that a preferred range of molecular weight of from 6,000 to 20,000 has been found most suitable. In like manner, the publication of Ku and Scala in J. Electrochem. Soc. 116, 980 (1969) teaches that for positive acting resists, the molecular weight has only a very minor effect on their efficiency. It should be noted that the Ku and Scala article reports experimental results using polymers having molecular weight up to a maximum of 200,000. The process of the present invention requires polymers with a molecular weight above one million.

SUMMARY OF THE INVENTION

In the manufacture of integrating circuits with high resolution masks for the protective coating on the surface of semi-conductor materials such as silicon and germanium, the achievement of higher and higher resolutions is desired. The use of optical masks or lens imaging methods is limited in practical resolution to about 2.5 microns. Electron beams on the other hand, because they can be generated with extremely small diameters, offer a preferred method to improve resolution. Electron beams can make devices as small as 0.1 microns for ultra fast computing circuits. Despite this advantage, however, if in the future electron beam lithography is to be competitive in cost and throughput with conventional photolithography, the required resist dose should be lowered as much as possible and preferably to no more than about $3 \times 10^{-6}$ coulombs per cm$^2$. An electron beam resist requiring such a low dosage suitable for use to produce ultramicrocircuitry in an economical manner is one of the objects of the present invention.

We have now discovered that the sensitivity of polymers to electron beam radiation is greatly increased by using polymers having a molecular weight of at least one million. By use of such polymers it now becomes possible for the first time to make positive electron beam resists sensitive enough to require no more than $3 \times 10^{-6}$ coulombs/cm$^2$.

The formation of a resist image depends upon the ratio of the rate of dissolution of the exposed areas to that of the unexposed areas. This ratio should be at least 2.0, and for practical considerations, it is preferably at least 4.0 to avoid the formation of pin holes in the developed films. We have now discovered that a high initial molecular weight of the starting polymer, that is a molecular weight above about one million, favors a large solubility ratio.

It is thus seen that, contrary to the predictions of the prior art, greatly improved performance in positive acting electron beam resists are obtained using materials of very high molecular weight, that is molecular weight above about one million. This enhanced performance is obtained through increasing the number of scissions per chain and also by increasing the solubility ratio. Over all, the sensitivity of electron beam resists has been enhanced so that they may be used economically in the range of about $3 \times 10^{-6}$ coulombs/cm$^2$, and so that electron beam lithography can be competitive in throughput with photolithographic production.

The process of the present invention is applicable to all polymers suitable for use in positive electron beam resist fabrication. Particularly suitable materials include poly (methylmethacrylate), poly (t-butylmethacrylate), poly (alphamethyl-styrene), poly, (methacrylonitrile) and poly (olefin sulfones) such as poly (butene-1-sulfone).

Typical solvents for use in the present invention include aromatic solvents such as m-xylene, chlorinated solvents such as carbon tetrachloride, esters such as methyl acetate, ethers such as tetrahydrofuran, ketones such as methyl isobutyl ketone, and hydrocarbons such as cyclopentane. Mixtures of solvents are also useful, with the optimum one depending upon the particular polymer being used.

In order to obtain the high solubility ratio and sensitivity to radiation of the present invention, it is necessary that the polymer have a molecular weight of at least one million. It is however, preferred that the molecular weight be still higher, preferably above ten million. Outstandingly good results have been obtained using polymers having molecular weights as high as 16 million. It seems to be generally true that the higher the molecular weight the better the results. The upper limit for any particular polymer is that molecular weight at which the polymer will still form a film which will adhere to the substrate without cracking.

The experimental details of preferred methods of carrying out the process of the present invention are given below in the following examples.

PREPARATION OF MATERIALS

Poly (methylmethacrylate) (PMMA), poly (tertiary butyl methacrylate) (PT-BMA) and poly(butene-1-sulfone) (PBS) were synthesized and fractionated to obtain molecular weights ranging from 10,000 to 10,000,000. The three stereoregular forms of PMMA were synthesized to evaluate any effect of polymer tacticity on resist sensitivity.

Methyl methacrylate monomer (Rohm and Haas) was passed through a column containing alumina (neutral grade, Woelm, W-200) to remove the inhibitor (10 ppm methyl ethyl hydroquinone) and was collected over calcium hydride. The fraction boiling at 40° C and 100 mm Hg pressure was collected and stored at 0° C under helium.

Tertiary butyl methacrylate monomer (Polysciences, Inc.) containing 100 ppm hydroquinone inhibitor was washed with 10 percent aqueous sodium carbonate until a clear, colorless solution was obtained. The monomer was dried over sodium sulfate, then passed through a column containing alumina (neutral grade) and collected over calcium hydride. The fraction boiling at 60° C and 51 mm Hg pressure was collected and stored at 0° C under helium.

Toluene of spectrograde quality was distilled from, and stored over calcium hydride. Tetrahydrofuran (THF) (Fisher Scientific Co.) was refluxed for 24 hours over potassium metal and was then distilled from lithium aluminum hydride.

Phenyl magnesium bromide (Alfa Inorganics), 3M in diethyl ether, was used without further purification. N-Butyllithium (Foote Mineral), 1.6M in hexane, was used as received. Fluorenyllithium was prepared by the metalation of fluorene in THF with n-butyllithium. Sodium naphthalide was prepared from sodium metal and naphthalene in THF solvent. T-butyl hydroperoxide, TBHP, Cadox TBH, was used as received.

Poly(methylmethacrylate)s: The atactic, syndiotactic and isotactic polymers were synthesized by procedures previously described in the literature.

Atactic poly(methylmethacrylate): A dry, 2-liter Parr Bomb (with glass sleeve) was purged with argon and charged with 250g (2.5M) MMA diluted to 1 liter with toluene. To this solution was added 0.5 ml (0.45g, 0.005M) t-butylhydroperoxide (TBHP) and the bomb was sealed. The mixture was always kept under argon. The temperature of the bomb was brought to 70° C and maintained at that temperature for 48 hours while stirring carefully. The reaction mixture was then poured into an excess of methanol and the recovered product filtered and dried. Polymer yield was 72.1g (30%).

Syndiotactic poly(methyl methacrylate): A mixture containing 1.66 g (0.01 mole) fluorene and 6.1 ml (0.0097 mole) n-butyllithium in 500 ml of THF in a 1l 3-necked reaction flask was stirred 1 hr. under argon at ambient temperature. The mixture was then cooled to −70° C in a dry ice-acetone bath and 83 g (0.83 mole) methyl methacrylate was added. The polymerization was carried out for 6 hr. to give a viscous solution which after addition of 5 ml methanol was poured into 2500 ml cold petroleum ether to precipitate the polymer. The polymer was filtered, dissolved in benzene, reprecipitated in petroleum ether, collected and vacuum dried 78 hr. at 50° C to give 82.7 g (99.7%) white product.

Isotactic poly(methyl methacrylate): Argon gas was bubbled through 32 g (0.32 mole) methyl methacrylate monomer dissolved in 425 ml toluene and a 1l 3-necked reaction flask. The mixture was cooled to 0° C and 3.6 ml phenylmagnesium bromide initiator was added. The mixture was stirred 4 hr. to give a viscous solution which was added to 2l vigorously stirred petroleum ether to precipitate the polymer. The filtered polymer was washed with acidified methanol then dissolved in benzene and reprecipitated in petroleum ether. The polymer was vacuum dried 72 hr. at 50° C to give 24.7 (82.3%) product.

Atactic poly(t-butyl methacrylate): The polymerization was carried out in a 250 ml 4-necked flask under a continuous flow of argon. Benzoylperoxide initiator (0.12 g, $4.9 \times 10^{-4}$ mole) was added to a stirred mixture of t-butylmethacrylate (71.1 g, 0.5 mole) in dry toluene (74 ml) at 70° C and the polymerization was continued for 15 hours. The viscous mixture was poured into 6 liters of vigorously stirred water to precipitate a white polymer. The polymer was purified by repeated precipitation from acetone/water, then collected and dried under vacuum at 50°–60° C for 72 hours to give 56 g (78.8%) product.

A butene-1-sulfur dioxide copolymer was prepared by the following procedure.

Butene-1 (99%, Matheson), 56.1 grams (1.0 mole) and sulfur dioxide (99.5%, Matheson), 192 grams (3.0 mole) were condensed into a 2 liter stainless steel Parr stirring autoclave at −78° C. The catalyst, 0.5 grams (3 $\times 10^{-3}$ mole) of azobisisobutyronitrile was then added. The reactor was sealed and heated for 18 hours at 45° C. The reactor was cooled to room temperature, opened, and the viscous contents were dissolved in chloroform. The chloroform solution was filtered and then added dropwise to cold petroleum ether to precipitate 49 g (40.8%) of a white polymer.

FRACTIONATION OF POLYMERS

The following fractionation procedure was carried out to isolate the different molecular weight fractions of polymers. The steps carried out are outlined for PMMA but are applicable for other polymers. The method and solvent volumes are somewhat arbitrary because small changes, such as in temperature, can cause large changes in the final fractions.

1. To a 3 l flask was added 5g PMMA and 500 ml chloroform. The polymer was dissolved by swirling and by gentle warming, if necessary.
2. Methanol was then added until the solution just became cloudy (ca. 1600 ml.). The solution was allowed to come to room temperature, then 1 ml increments of MeOH were added until the solution was turbid. If too much MeOH was added, the polymer began to flock and more chloroform would have to be added.
3. A cover was placed over the flask and it was heated on a steam bath until the solution was clear.
4. The flask was placed in an insulated box and allowed to come to ambient temperature very slowly.
5. When a film of polymer had formed on the bottom of the flask (at least 24 hr.), the supernatant liquid was decanted into another container and the polymer film removed and dried.
6. The supernatant liquid was returned to the flask and ca. 35 ml MeOH added to yield a turbid solution. The above steps were repeated for a second cut.
7. The above steps were repeated for a third cut.
8. For the fourth fraction, a large excess of MeOH was added, ca. 1 liter. The turbid solution yielded a polymer film in 2 days.

9. For the fifth fraction, the solution was allowed to evaporate.

MOLECULAR WEIGHT CHARACTERIZATION

Molecular Weight distribution and molecular weight averages (number and weight averages) were obtained with a modified Water's Associates (GPC-200 Gel Permeation Chromatograph (GPC). The chromatograph was run under ambient conditions using THF at 1 ml/min flow rate through columns packed with $10^6$, $10^5$, $10^4$, $10^3$, 250 and 50 A polystyrene. $\overline{M}_w$ and $\overline{M}_n$ values, corresponding to chain extended molecular sizes based on polystyrene, were determined by a computer programmed analysis of the chromatograms. Molecular weights were also measured by light scattering and by intrinsic viscosity methods.

STEREOCHEMICAL ASSIGNMENTS

The stereochemical assignments for the methacrylate polymers were determined in o-dichlorobenzene at 148° C with a Varian HA-100 NMR spectrometer using hexamethyldisiloxane as an internal standard. The peak areas due to the α-methyl protons in the isotactic, heterotactic and syndiotactic triads at δ = 1.22, 1.05 and 0.91 ppm, respectively, were measured with a planimeter and by a weighing technique.

MOLECULAR WEIGHT STUDIES OF EXPOSED POLYMERS

The molecular weights of the exposed and unexposed polymer fractions were determined by Gel Permeation Chromatography (GPC). Thin polymer films were exposed to radiation up to 25 kV electron beam dosages.

RESIST SENSITIVITY MEASUREMENTS

Spin coated films of the polymers (0.7–1.2μ) on oxidized silicon wafers were prebaked and processed according to conventional procedures. PMMA was developed in methyl isobutyl ketone (MIBK). The thicknesses of the unexposed and exposed films were measured with a Taylor Hobson Talystep instrument.

EXPERIMENTAL RESULTS

The following table shows typical results obtained at 15kV, and demonstrates the greatly increased sensitivity of the system when the starting polymer has a molecular weight above 1,000,000.

| POLY (METHYL METHACRYLATE) | | |
|---|---|---|
| $\overline{M}_n$ | Solubility Ratio | Minimum Dosage at 15KV |
| 1,271,000 | 2.0 | $3.0 \times 10^{-6}$ Coulombs/cm$^2$ |
| 225,000 | 2.0 | $4.5 \times 10^{-6}$ Coulombs/cm$^2$ |
| POLY (t-BUTYL METHACRYLATE) | | |
| $\overline{M}_n$ | Solubility Ratio | Minimum Dosage at 15 KV |
| 1,098,000 | 2.0 | $3.0 \times 10^{-6}$ Coulombs/cm$^2$ |
| 81,000 | 2.0 | $6.6 \times 10^{-6}$ Coulombs/cm$^2$ |
| POLY (BUTENE-1-SULFONE) | | |
| $\overline{M}_v$ * | Solubility Ratio | Minimum Dosage |
| 1,080,000 | 2.0 | $2.5 \times 10^{-6}$ Coulombs/cm$^2$ |
| 87,000 | 2.0 | $4.0 \times 10^{-6}$ Coulombs/cm$^2$ |

*$\overline{M}_v$ = Molecular weight by viscosity.

The foregoing examples were given solely for purposes of illustration and are not to be considered limitations on the invention, many variations of which are possible without departing from the spirit or scope thereof.

What is claimed is:

1. In a process for preparing a positive acting polymeric electron beam resist the improvement according to which the number average molecular weight of the starting polymeric resist material is at least one million and the radiation exposure is a dosage less than about $3 \times 10^{-6}$ coulombs per cm$^2$, and the polymeric resist material is selected from the group consisting of poly (methyl methacrylate), poly (t-butyl methacrylate), poly (alpha-methyl-styrene) and poly (methacrylonitrile).

2. A process as claimed in claim 1 wherein the number average molecular weight of the starting polymeric resist material is at least ten million.

3. A process as claimed in claim 1 wherein the amount of radiation is less than $1 \times 10^{-6}$ coulombs per cm$^2$.

4. A process as claimed in claim 1 wherein the polymeric resist material is polymethylmethacrylate.

5. A process as claimed in claim 1 wherein the polymeric resist material is poly (t-butylmethacrylate).

6. A process as claimed in claim 1 wherein the polymeric resist material is poly (alpha-methylstyrene).

* * * * *